United States Patent [19]

Maier

[11] 4,103,101
[45] Jul. 25, 1978

[54] OUTLET BOX CONNECTOR AND COMBINATION

[76] Inventor: William Maier, 409 Bishop Ave., Bridgeport, Conn. 06610

[21] Appl. No.: 781,862

[22] Filed: Mar. 28, 1977

[51] Int. Cl.² .............................................. H05K 5/02
[52] U.S. Cl. ................................ 174/65 R; 285/158; 285/396
[58] Field of Search ............. 174/65 R; 285/158, 189, 285/396, 402; 339/122 R, 124, 126 R, 127 R, 127 C, 188 R, 188 C, 188 T, 90 R, 90 F; 248/27.1, 56

[56] References Cited

U.S. PATENT DOCUMENTS

| 1,131,399 | 3/1915 | McGinley | 174/65 R |
|---|---|---|---|
| 2,170,010 | 8/1939 | Conner | 285/158 X |
| 3,047,829 | 7/1962 | Mouat | 339/127 R |
| 3,369,071 | 2/1968 | Tuisku | 174/65 R |
| 3,728,470 | 4/1973 | Maier | 174/65 R X |
| 4,012,578 | 3/1977 | Moran et al. | 174/65 R X |

Primary Examiner—J. V. Truhe
Assistant Examiner—David A. Tone

[57] ABSTRACT

A one-piece connector for connecting electric cables to an electrical outlet box comprises a tubular body having an inner portion adapted to fit inside an opening in an outlet box, an outer portion adapted to receive a sheathed cable therein, an annular shoulder on the connector for abutting the outer surface of the box wall, a pair of arcuate lugs provided at diametrically opposite sides of the connector for passage through recesses in the edge of the box opening when the connector is inserted in the opening, the lugs having arcuately spaced opposite side edges, raised arcuate portions between the shoulder and the arcuate lugs which exceed the diameter of the opening in the box wall and become wedged against the edge of the opening when the connector is rotated in the opening, the arcuate raised portions each beginning at one side edge of one of the arcuate lugs and terminating medially between the opposite side edges of the respective arcuate lug, flat raised portions beginning at the medial terminus of the arcuate raised portions and continuing to the other side edge of the arcuate lugs providing a raised surface of increasing diameter as the connector is rotated in order to limit the rotation of the connector in the box opening, an annular bushing inside the tubular body which is integral with the connector and is adapted to fit between the cable sheath and cable insulation at the end of a cable inserted in the outer portion of the tubular connector, and inwardly depressed helical tongues formed integral with the connector in the outer portion for engaging grooves in the cable sheath and locking the cable in the connector.

16 Claims, 11 Drawing Figures

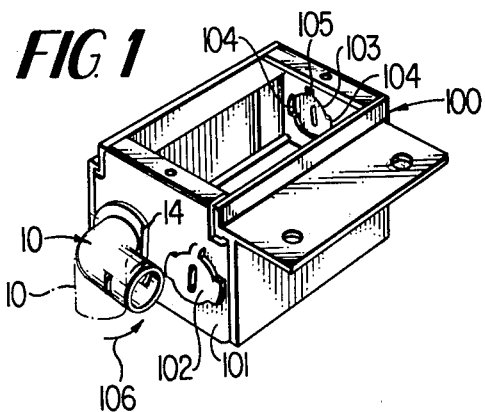
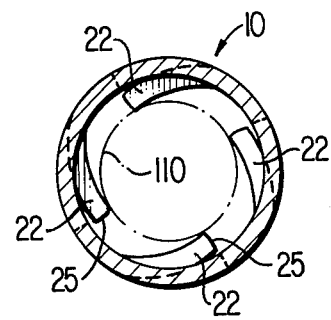
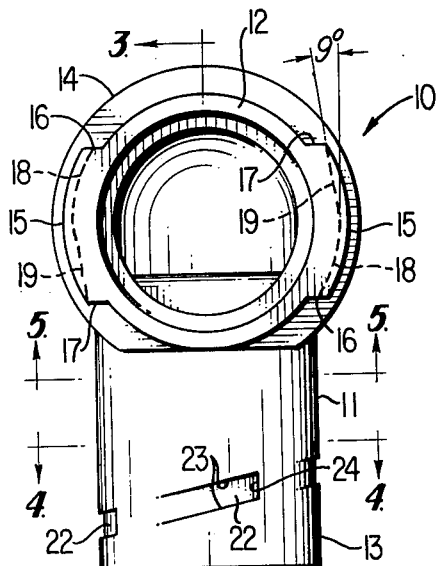
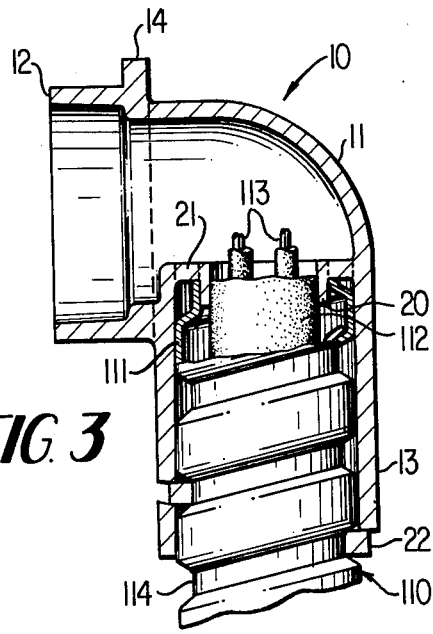
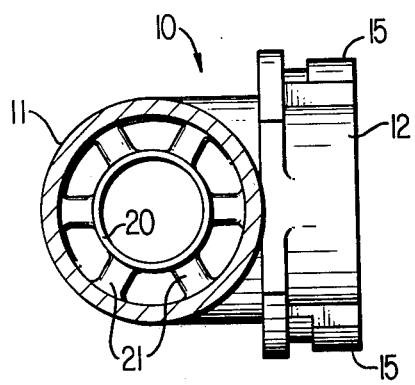
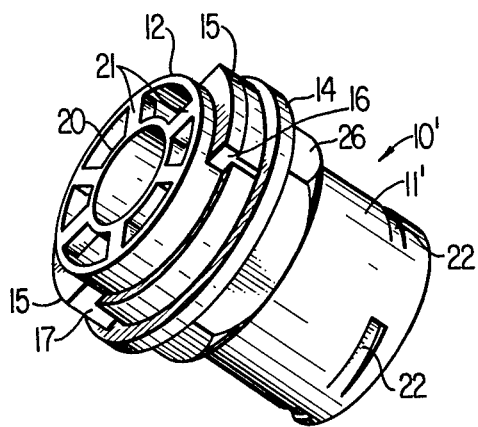

OUTLET BOX CONNECTOR AND COMBINATION

BACKGROUND OF THE INVENTION

1. Field of the Invention

This invention relates to an improved electrical outlet box connector and combination outlet box and connector.

2. Description of the Prior Art

This invention is an improvement upon the outlet box connector disclosed in my prior U.S. pat. No. 3,728,470 issued Apr. 17, 1973 for an ELECTRICAL OUTLET BOX WITH CABLE CONNECTORS. The outlet box disclosed in my aforesaid patent is provided with knock-out plugs which, when removed, result in formation of irregularly shaped openings for reception of cable connectors. Each knock-out plug is shaped so that when it is removed it leaves a substantially circular yet irregular opening, the edge of the opening having a pair of diametrically opposed arcuate recesses. The connector disclosed in my aforesaid patent which is adapted to be inserted in one of the outlet box openings and rotated approximately 90° to lock the connector in the opening comprises a tubular body an inner portion adapted to be inserted in the box opening and an outer portion adapted to receive the end of an electrical cable. An annular shoulder is provided on the connector for abutting the outer surface of the box wall surrounding an opening therein and a pair of arcuate lugs is provided at diametrically opposite sides of the connector for passage through recesses in the edge of the box opening when the connector is inserted in the opening. Raised arcuate portions are provided between the annular shoulder and the arcuate lugs which exceed the diameter of the opening the box wall and become wedged against the edge of the opening when the connector is rotated in the opening. The walls of the outlet box which have the knock-out plugs are of relative hard metal while the connector is made of a softer metal so that when the connector is rotated in the opening, hard metal edges provided in the opening bite into the soft metal raised portions. Experience with the outlet boxes and connectors disclosed in my aforesaid patent has shown that sometimes an excessive turning force is applied when rotating the connector in the box opening which will strip the upper layer of metal from the raised portion and which will defeat the wedging action of the raised portions allowing the connector to turn freely in the opening.

The present invention includes the features described above of the outlet box and connector disclosed in my aforesaid patent but is an improvement thereover in that diametrically opposed flat raised portions are provided adjacent to the arcuate portions which provide areas of increasing diameter as the connector is turned in order to provide a positive stop at the end of the raised arcuate portions to limit further rotation of the connector should an excessive torque be applied in rotating the connector which would tend to strip off the upper surfaces of the raised arcuate portions.

Another feature of the present invention which is an improvement over the connector of my prior patent is an annular bushing integrally mounted within the connector and spaced from the inside surface thereof to serve as a spacer between the out metal sheath of a metal sheathed cable and the cable insulation at the end of the cable inserted in the outer portion of the connector. The integral bushing replaces separate bushings which many electrical codes require. The bushing distinguishes from the cable end stop provided in the connector of my prior patent in that it fits inside of the cable sheath whereas the end stop of the connector of my prior patent does not.

Still another feature of the present invention is the provision of inwardly depressed helical tongues integral with the connector for engaging grooves in the cable sheath and for locking the cable in the connector. Each of the tongues is formed by making axially spaced parallel helical cuts through the wall of the connector forming side edges of the tongue and by making a transverse cut across corresponding ends of the helical cuts forming a free end of the tongue. The tongue is bent inwardly about a hinge line across the corresponding ends of the helical cuts opposite said free end. The tongues are spaced in a helical pattern about the connector beginning at the outer end of the outer portion thereof spiralling inwardly in the manner of internal threads. A sheathed metal cable having helical grooves formed on its outer surface may be threaded into the outer portion of the connector until the inner end of the cable is forced against the inner bushing. The tongues prevent the cable from being pulled out of the connector by an axial force and prevent the cable from being screwed reversely by the action of the sharp edges at the free end of the tongue digging into the cable sheath. Helical internal threads in a connector are not new, however the helically arranged inwardly depressed tongues of the present invention are believed to an improvement over the prior art.

SUMMARY OF THE INVENTION

The invention relates to new and useful improvements in electrical outlet box connectors, and a principal object of the invention is to provide an improved outlet box connector which fits into an irregular opening in an outlet box and is locked therein by rotating the connector to force diametrically opposed arcuate raised portions on the outer surface of the connector against edges of the opening and to provide additional diametrically opposed raised portions of increasing diameter in the direction of the locking motion to limit the turning of the connector in the opening.

It is a further object of the invention to provide a one-piece electrical outlet box connector having an annular bushing coaxially spaced inside of the connector and integrally supported therein which fits between the metal sheath of the metal sheathed cable and the cable insulation at the end of the cable.

It is a further object of the invention to provide inwardly depressed helical tongues integral with the connector for engaging grooves in the cable sheath to lock the cable in the connector.

It is still a further object of the invention to provide an improved one-piece electrical outlet box connector which may comprise either a straight tubular body, or an elbow having one or more of the aforesaid improved features.

It is still a further object of the invention to provide in combination with a metal outlet box having a wall provided with a substantially circular opening and with diametrically opposed arcuate recesses in the edge of the opening an improved cable connector rotatably received in the opening, the connector having an improved cam lock for locking the connector in the opening.

BRIEF DESCRIPTION OF THE DRAWINGS

With the foregoing more important objects and features in view and such other objects and features which may become apparent as this specification proceeds, the invention will be understood from the following description taken in conjunction with the accompanying drawings, in which like characters of reference are used to designate like parts, and in which:

FIG. 1 is a perspective view of the combination of an electrical outlet box with one embodiment of the improved electrical connector of this invention in the form of an elbow mounted therein;

FIG. 2 is an elevational view of the outlet box connector shown in FIG. 1 looking at the inner end;

FIG. 3 is a longitudinal sectional view of the connector taken on line 3—3 of FIG. 2;

FIG. 4 is a sectional view of the connector taken on line 4—4 of FIG. 2;

FIG. 5 is a sectional view of the connector taken on line 5—5 of FIG. 2;

FIG. 6 is a perspective view of another embodiment of the invention in the form of a straight tubular connector;

DESCRIPTION OF THE PREFERRED EMBODIMENTS

Figure 7:
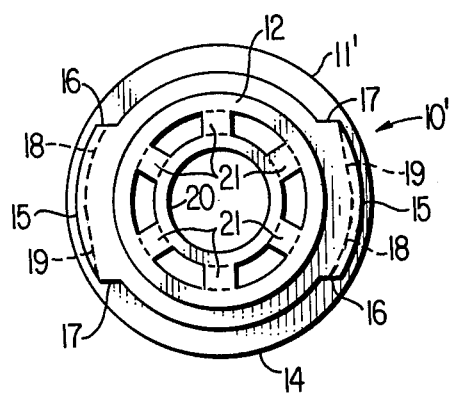
FIG. 7 is an elevational view looking at the inner end of the connector shown in FIG. 6.
Figure 8:
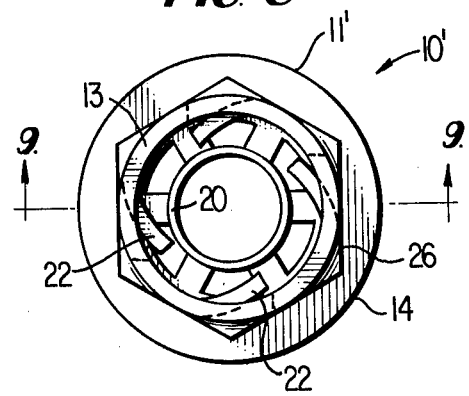
FIG. 8 is an elevational view looking at the outer end of the connector shown in FIG. 6.
Figure 9:
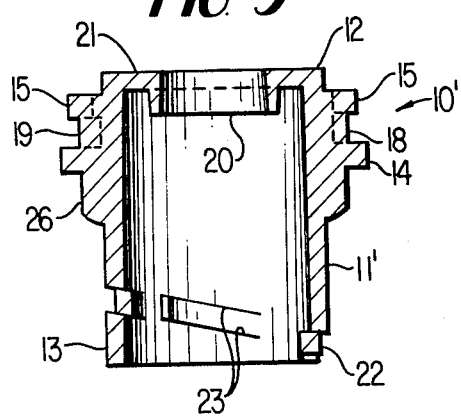
FIG. 9 is a sectional view taken taken on line 9—9 of FIG. 8.
Figure 10:
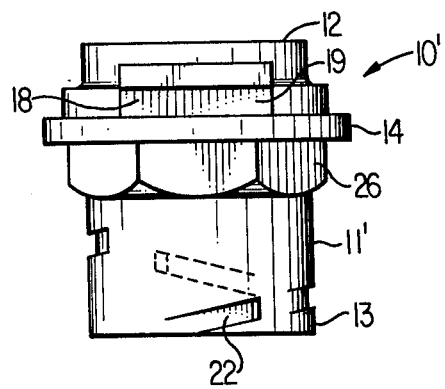
FIG. 10 is a side elevational view of the connector shown in FIG. 6.

Referring now to the drawings and particularly to FIGS. 1 through 5 one embodiment of the electrical outlet box connector of this invention in the form of an elbow is generally indicated by the numeral 10. In FIG. 1 the connector 10 is shown in combination with an electrical outlet box 100 of the same type as the outlet box disclosed in my aforesaid U.S. pat. No. 3,728,470. The outlet box 100 has at least one end wall 101 which is provided with one or more knock-outs 102 which when it is removed from the box leaves a substantially circular yet irregular opening 103, the edge of the opening having a pair of diametrically opposed, arcuate recesses 104 and a sharp notch 105 at one side of the opening between the recesses. The elbow connector 10 is shown mounted in one of the openings 103, which is hidden from view by the connector 10, in the front end wall 101. The solid lines show the elbow as it is inserted in the opening while the phantom lines show the connector after it has been rotated in the direction of the arrow 106 to its locked position.

The connector 10 comprises a tubular metal body 11 which is molded in one-piece in the shape of an elbow. The body 11 has an inner end portion 12 which is adapted to be inserted in the opening 103 and an outer end portion 13 perpendicular to the inner end portion which remains outside of the box 100 and which receives the end of a metal sheathed electric cable 110 as shown in FIG. 3. The connector 10 is provided with an annular shoulder 14 which abuts the outer surface of the box end 101 when the connector is inserted in the opening 103. The inner end portion 12 which is inserted into the opening is provided with a pair of diametrically opposite lugs 15. The lugs 15 each have arcuately spaced side edges 16 and 17 - the edge 16 being a leading edge and the edge 17 being a lagging edge considered with respect to the direction of rotation of the connector from its position upon insertion in an opening 103 to its locked position approximately 90° removed from its position upon insertion. Beginning adjacent the leading edge 16 and extending to an approximate mid point between the leading and lagging edges 16 and 17 are provided diametrically opposed arcuate raised portions 18 between the lugs 15 and the annular shoulder 14. The diameter of the raised arcuate portions exceeds the diameter of the opening 103 so that the raised portions become wedged against the edge of the opening when the connector is rotated to its locked position. Additional raised portions 19 extend between the lugs 15 and the shoulder 14 from the inner end of the arcuate raised portions to adjacent the lagging edge 17 of the lugs. The diameter across the additional raised portions 19 increases uniformly from the adjacent terminus of the arcuate raised portions 18 to the lagging edge 17. The surface of each of the additional raised portions is planar and forms an angle of approximately 9° with a line tangent to the arcuate raised portion 18 at its junction with the additional raised portion. The additional raised portions 19 provide a wedge surface of increasing height at the inner ends of the arcuate raised portions to limit the extent of rotation of the connector in the opening 103.

When the connector 10 is to be inserted in the opening 103, it is positioned in the manner shown by solid lines in FIG. 1 with the lugs 15 aligned with the recesses 104, and the inner end portion 12 is pushed inwardly until the annular shoulder 14 abuts against the end wall 101. The connector 10 is then rotated in the direction of arrow 106 first forcing the arcuate raised portions 18 against the edge of the circular opening and finally the additional raised portions 19 against the edge of the circular opening 103 until the connector is firmly locked in the opening against rotation. The lugs 15 and the annular shoulder 14 being on opposite sides of the wall 101 in the locked position prevent axial displacement of the connector from the opening 103.

An annular bushing 20 is supported coaxially within the outer portion 13 of the connector by a plurality of uniformly spaced radial spiders 21 which are integrally molded with the bushing 20 and the tubular body 11. The bushing 20 tapers with diminishing thickness from its point of connection with the spiders 21 where it is of greatest thickness outwardly so that it can be easily wedged between the metal sheath 111 and the insulation 112 surrounding the conductors 113 of the cable.

In order to lock the cable 110 in the outer end portion 13 a plurality of inwardly depressed helical tongues 22 are struck from the connector in a helical pattern as best seen in FIG. 2. The tongues 22 are each formed by making axially spaced parallel cuts 23 through the body 11 to form the side edges of the tongue and by making a transverse cut 24 across the innermost ends of the helical cuts to form the free end 25 of the tongue. The free end of each tongue 22 is depressed inwardly about a bend line across the ends of the helical cuts 23 opposite to the free end. The pitch of the helical tongues 22 corresponds with the pitch of the helical grooves 114 in the metal cable sheath 111 so that the cable 110 can be screwed into the outer portion 13 of the connector.

When mounting the cable 110 in the connector 10, one end of the cable is screwed into the connector by engaging the tongues 22 in the grooves 114 of the cable sheath and turning the cable relative to the connector until the end of the cable is forced up against the bushing 20 and the bushing becomes wedged between the cable sheath 111 and the cable insulation 112 in the manner shown in FIG. 3. The cable 110 is held in the connector against axial displacement by the tongues 22 in the grooves of the cable sheath. Any tendency for the cable to become unscrewed from the connector is resisted by the free ends of the tongues 22 bearing against the cable sheath 111 in the grooves 114 where the sharp bottom edges of the free ends of the tongues tend to bite into the metal sheath.

In FIGS. 6-11 a connector 10' which has a straight tubular body 11' is shown. The connector 10' is essentially like the connector 10 of FIGS. 1-5 except for its shape, therefore, the same reference numerals have been used to indicate the parts of the connector 10' which correspond with like parts of the connector 10. A description of the parts of the connector 10' which correspond to similar parts of connector 10 is unnecessary since the parts can be readily identified by referring back to the description of connector 10.

Unlike the elbow connector 10, the straight connector 10' has a hexagonal outer surface portion 26 on the outer end portion 13 adjacent the annular shoulder 14. The hexagonal portion 26 provides means for engagement with a wrench so that the connector 10' may be given a quarter turn after it is inserted in an opening 103 in an outlet box to lock the connector in place in the opening. A similar hexagonal surface portion could be provided on the elbow connector 10 if desired but it is not as important to have it on the elbow because the right angle outer portion 13 of the elbow, when grasped by the hand, provides a lever arm for rotating the connector.

Figure 11:
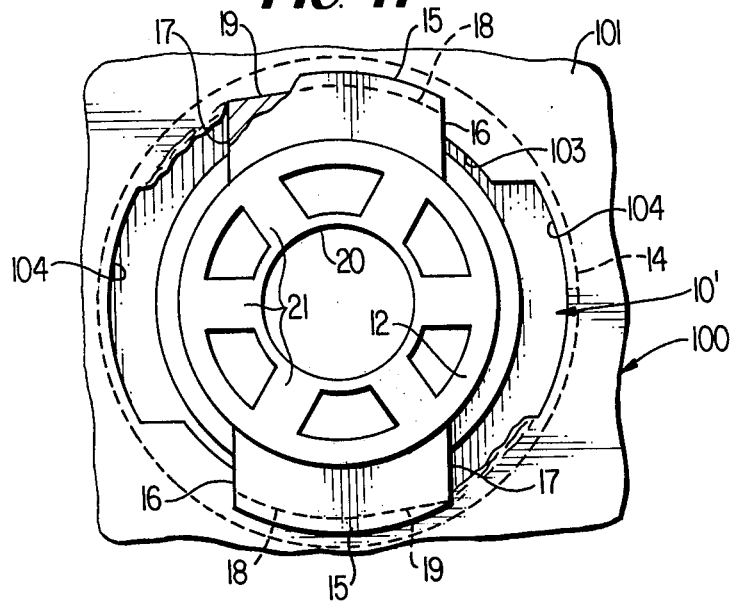
FIG. 11 is an enlarged fragmentary elevational view looking at the inner end of the connector of FIG. 6 mounted in an opening in a wall of an outlet box and showing the connector in its locked position.

FIG. 11 shows the connector 10' after its inner end 12 has been inserted in an opening 103 in an end wall 101 of an electrical outlet box, and given a quarter turn (clockwise as seen in FIG. 11) to the position shown where the connector is in locked position. At the end of substantially a quarter turn, as shown in FIG. 11, the corners formed by the trailing edges 17 and the flat surface of the raised portions 19 bite into the edge of the opening 103 until the connector can't be turned anymore.

While FIG. 11 specifically shows the straight connector 10' locked in an opening in a wall of an outlet box, the elbow connector 10 would be locked in a similar manner.

The assembly of a flexible cable or conduit with an outlet or junction box using the connector of the present invention is a very simple operation requiring essentially only two steps as follows:

1. Thread the metal sheathed conduit 110 into the connector 10 or 10' until the bushing 20 is seated between the metal sheath 111 and the cable insulation 112 as shown in FIG. 3.

2. Insert the connector 10 or 10' with the conduit 110 assembled therein into the opening 103 in an outlet, or junction box, and give the connector a quarter turn.

The time lapse from the beginning to the end of the assembly operation is in the order of from 10 to 15 seconds. This is a decided advantage of the present invention over prior art connectors which require installation of separate anti-short bushings lock nuts and screw fasteners and often takes 1 to 2 minutes or longer for assembly.

It is to be understood that the connectors of this invention are not limited to use with the outlet box shown in FIG. 1, but may be used in combination with other outlet and junction boxes having at least one circular opening 103 with diametrically opposed recesses 104,104. The material of the connector, particularly the material of the raised portions 18 and 19, is preferably softer than the material of the portion of the outlet box in which the opening for receiving the connector is located so that the arcuate portions 18 will tend to deform as the connector is given a quarter turn in the outlet box opening.

While in the foregoing there has been described and shown a preferred embodiment of the invention, various modifications and equivalents may be resorted to within the spirit and scope of the invention as claimed.

What is claimed is:

1. The combination of an electrical outlet box having a wall provided with a substantially circular opening and with diametrically opposed arcuate recesses in the edge of the opening, a cable connector rotatably received in said opening, an annular shoulder provided on said connector for abutting the outer surface of the box wall, and a pair of arcuate lugs provided at diametrically opposite sides of the connector for passage through said recesses when the connector is inserted in the opening, the connector being rotatable in the opening to a fastened position wherein said lugs abut the inner surface of the box wall to retain the connector and box in assembled relation, portions of said connector being raised to exceed the diameter of said opening in the box wall, said raised portions becoming wedged against the edge of the opening when the connector is rotated to its fastened position, the improvement wherein said raised portions include a pair of diametrically opposed arcuate raised portions and a pair of diametrically opposed flat raised portions, the flat raised portions being continuations of said arcuate raised portions and providing a raised surface of increasing diameter as the connector is rotated in said opening to limit rotation of the connector in said opening.

2. The combination set forth in claim 1 wherein said connector is tubular and includes an inner end portion which extends inside of said box and an outer end portion which extends outside of said box when said connector is fastened in assembled relationship with said box, said outer end portion having plurality of inwardly depressed helical tongues formed integral with the connector in a helical pattern for engaging helical grooves in a flexible metallic cable sheath when a cable having the flexible metalic sheath is screwed into the outer end portion of said connector.

3. The combination set forth in claim 2 wherein each of said tongues is formed by cutting the wall of said connector along a pair of axially spaced parallel helical lines to form parallel side edges of said tongues and by cutting an end cut across the inner ends of said parallel helical lines to form a free end of said tongue, said tongue being depressed inwardly from the wall of said connector about a bend line at the other end of said parallel helical lines opposite said free end.

4. The combination set forth in claim 3 wherein said free end of each of said tongues has a sharp bottom edge for biting into the bottom surface of the groove in the metalic flexible cable connector in order to resist rotation of the cable in a direction to unscrew the cable from the connector.

5. The combination of claim 1 wherein said connector is a one piece tubular elbow and includes an inner end portion which extends inside of said box and an outer end portion which extends outside of said box when said connector is fastened in assembled relation with said box.

6. The combination of claim 5 wherein said connector has an annular bushing integrally supported coaxially within the outer end portion thereof to provide a spacer for separating the inner end of a flexible metallic cable sheath from the inner insulation of a cable having the flexible metallic sheath.

7. The combination of claim 1 wherein said connector is tubular and includes an inner end portion which extends inside of said box, an outer end portion which extends outside of said box when said connector is fastened in assembled relation with said box, and an annular bushing integrally supported coaxially within said connector to provide a spacer for separating the inner end of a flexible metalic cable sheath from the inner insulation of a cable supported within said outer end portion and having the flexible metalic sheath.

8. The combination of claim 7 wherein said bushing has a tubular wall of constant internal diameter and of progressively decreasing external diameter moving from the inner end to the outer end thereof.

9. An electrical outlet box cable connector for use with an electrical outlet box having a wall provided with a substantially circular opening and with diametrically opposed arcuate recesses in the edge of the opening, said connector comprising a tubular body, an annular shoulder provided on said body for abutting the outer surface of the box wall, a pair of arcuate lugs provided at diametrically opposite sides of the connector for passage through the recesses of the box when the connector is inserted in the opening, said lugs being axially spaced from said annular shoulder so that said lugs will engage the inner surface of the box wall when the connector is rotated in the opening to a fastened position to retain the connector and box in assembled relation, portions of said tubular body between said lugs and said annular shoulder being raised to exceed the diameter of the opening in the box wall, whereby said raised portions may become wedged against the edge of the opening when the connector is rotated to its fastened position, the improvement wherein said raised portions include a pair of diametrically opposed arcuate raised portions and a pair of diametrically opposed flat raised portions, the flat raised portions being continuations of said arcuate raised portions and providing a raised surface of increasing diameter as the connector is rotated in the opening toward its fastened position to limit rotation of the connector in the opening.

10. The connector of claim 9 wherein said tubular body includes an inner end portion which extends inside the box and an outer end portion which extends outside of the box when said connector is fastened in assembled relationship with the box, said outer end portion having a plurality of inwardly depressed helical tongues formed integral with the connector in a helical pattern for engaging helical grooves in a flexible metalic cable sheath when a cable having the flexible metallic sheath is screwed into the outer end portion of said connector.

11. The connector of claim 10 wherein each of said tongues is formed by cutting the wall of said connector along a pair of axially spaced parallel helical lines to form parallel side edges of said tongues and by cutting an end cut across the inner ends of said parallel helical lines to form a free end of said tongue, said tongue being depressed inwardly from the wall of said connector about a bend line at the other end of said parallel helical lines opposite said free end.

12. The connector of claim 11 wherein said free end of each of said tongues has a sharp bottom edge for biting into the bottom surface of the groove in the metallic flexible cable connector inorder to resist rotation of the cable in a direction to unscrew the cable from the connector.

13. The connector of claim 9 wherein said connector is a one piece tubular elbow and includes an inner end portion for insertion inside of the outlet box and an outer end portion which remains outside of the outlet box when said connector is fastened in assembled relation with the outlet box.

14. The connector of claim 13 wherein said connector has an annular bushing integrally supported coaxially within the outer end portion thereof to provide a spacer for separating the inner end of a flexible metallic cable sheath from the inner insulation of a cable having the flexible metallic sheath.

15. The connector of claim 9 wherein said connector is tubular and includes an inner end portion for insertion inside of an outlet box, an outer end portion which remains outside of the outlet box when said connector is fastened in assembled relation with the outlet box, and an annular bushing integrally supported coaxially within said connector to provide a spacer for separating the inner end of a flexible metallic cable sheath from the inner insulation of a cable supported within said outer end portion and having the flexible metallic sheath.

16. The combination of claim 15 wherein said bushing has a tubular wall of constant internal diameter and of progressively decreasing external diameter moving from the inner end to the outer end thereof.

* * * * *